United States Patent
Lee et al.

(10) Patent No.: US 11,054,706 B2
(45) Date of Patent: Jul. 6, 2021

(54) DISPLAY DEVICE

(71) Applicant: Samsung Display Co., Ltd., Yongin-si (KR)

(72) Inventors: Yong Hee Lee, Suwon-si (KR); Seong Young Lee, Hwaseong-si (KR); Kyung Ho Kim, Seongnam-si (KR); Seung Min Lee, Seoul (KR); Na Hyeon Cha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 38 days.

(21) Appl. No.: 16/375,859

(22) Filed: Apr. 5, 2019

(65) Prior Publication Data

US 2020/0103688 A1    Apr. 2, 2020

(30) Foreign Application Priority Data

Sep. 28, 2018  (KR) .................. 10-2018-0115867

(51) Int. Cl.
  *G02F 1/1362*  (2006.01)
  *H01L 27/12*   (2006.01)
  *G02F 1/1368*  (2006.01)
  *H01L 29/786*  (2006.01)

(52) U.S. Cl.
  CPC .......... *G02F 1/1362* (2013.01); *G02F 1/1368* (2013.01); *G02F 1/13624* (2013.01); *G02F 1/136286* (2013.01); *H01L 27/124* (2013.01); *H01L 27/1244* (2013.01); *H01L 29/78633* (2013.01); *G02F 1/13629* (2021.01); *G02F 1/136218* (2021.01); *G02F 1/136222* (2021.01);

(Continued)

(58) Field of Classification Search
  None
  See application file for complete search history.

(56) References Cited

U.S. PATENT DOCUMENTS

| 8,809,865 B2 | 8/2014 | Park et al. |
| 9,207,506 B2 | 12/2015 | Jung et al. |
| 9,983,453 B2 | 5/2018 | Jung et al. |

(Continued)

FOREIGN PATENT DOCUMENTS

| KR | 10-2014-0045014 | 4/2014 |
| KR | 10-2016-0042256 | 4/2016 |

(Continued)

*Primary Examiner* — James A Dudek
(74) *Attorney, Agent, or Firm* — H.C. Park & Associates, PLC

(57) ABSTRACT

A display device includes: a substrate; a gate line disposed on the substrate and configured to transmit a gate signal; a reference voltage line disposed apart from the gate line and configured to transmit a reference voltage; an insulation layer disposed on the gate line and the reference voltage line; a pixel electrode layer including: a first sub-pixel electrode disposed on the insulation layer and located at a first side with reference to the gate line; and a second sub-pixel electrode disposed on the insulation layer and located at a second side opposite to the first side with reference to the gate line; and a conductive shield portion disposed on the gate line, wherein the gate line includes two parallel edges, an edge closer to the reference voltage line among the two parallel edges including a first edge, and wherein the conductive shield portion overlaps the first edge.

20 Claims, 7 Drawing Sheets

(52) U.S. Cl.
CPC .. *G02F 1/136245* (2021.01); *G02F 1/136295* (2021.01); *G02F 2201/40* (2013.01)

(56) References Cited

U.S. PATENT DOCUMENTS

| | | |
|---|---|---|
| 2016/0097958 A1 | 4/2016 | Lee et al. |
| 2017/0038629 A1* | 2/2017 | Joo .................. G02F 1/13394 |
| 2017/0108723 A1* | 4/2017 | No .................... G02F 1/1368 |

FOREIGN PATENT DOCUMENTS

| | | |
|---|---|---|
| KR | 10-2017-0005331 | 1/2017 |
| KR | 10-1732939 | 5/2017 |

* cited by examiner

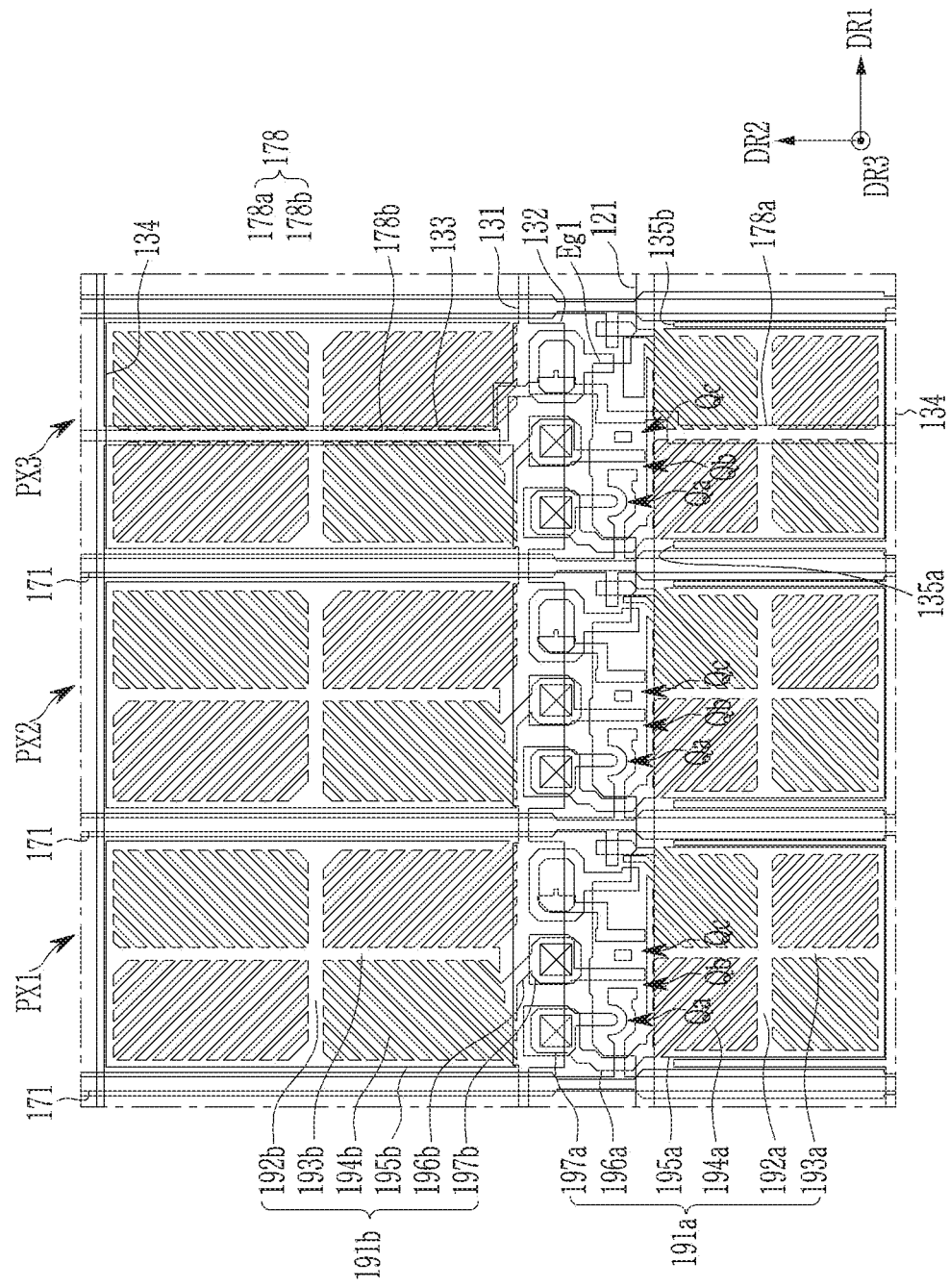

DISPLAY DEVICE

CROSS-REFERENCE TO RELATED APPLICATION

This application claims priority from and the benefit of Korean Patent Application No. 10-2018-0115867, filed on Sep. 28, 2018, which is hereby incorporated by reference for all purposes as if fully set forth herein.

BACKGROUND

Field

Exemplary embodiments of the invention relate generally to a display device.

Discussion of the Background

A display device such as a liquid crystal display (LCD), an organic light emitting diode (OLED) display, and the like includes a display panel that includes a plurality of pixels, which are units for displaying an image, in general.

A display panel of the LCD includes a liquid crystal layer including liquid crystal molecules, a field generation electrode that controls alignment of the liquid crystals of the liquid crystal layer, a plurality of signal lines that apply a voltage to at least a part of the field generation electrode, and a plurality of switches that are connected to the plurality of signal lines. When a voltage is applied to the field generation electrode, an electric field is generated in the liquid crystal layer and thus liquid crystals are realigned, and accordingly, a desired image can be displayed by adjusting the amount of transmitted light. The display panel may include at least one polarizer to adjust the amount of transmitted light.

The field generation electrode included in the LCD includes a pixel electrode that receives a data voltage and a common electrode that receives a common voltage. The pixel electrode may receive a data voltage through a switch, which may be a transistor.

The above information disclosed in this Background section is only for understanding of the background of the inventive concepts, and, therefore, it may contain information that does not constitute prior art.

SUMMARY

Devices constructed according to exemplary implementations of the invention are capable of providing a display device that can prevent or reduce light leakage while increasing an aperture ratio, thereby improving efficiency and characteristics of light.

Additional features of the inventive concepts will be set forth in the description which follows, and in part will be apparent from the description, or may be learned by practice of the inventive concepts.

According to one or more exemplary embodiments of the invention, a display device includes: a substrate; a gate line disposed on the substrate and configured to transmit a gate signal; a reference voltage line disposed apart from the gate line and configured to transmit a reference voltage; an insulation layer disposed on the gate line and the reference voltage line; a pixel electrode layer including: a first sub-pixel electrode disposed on the insulation layer and located at a first side with reference to the gate line; and a second sub-pixel electrode disposed on the insulation layer and located at a second side opposite to the first side with reference to the gate line; and a conductive shield portion disposed on the gate line, wherein the gate line includes two parallel edges, an edge closer to the reference voltage line among the two parallel edges including a first edge, and wherein the conductive shield portion overlaps the first edge.

The conductive shield portion may be configured to transmit a constant voltage.

The gate line may include a first gate electrode, a second gate electrode, and a third gate electrode, and the display device may further include: a first transistor including the first gate electrode, a first source electrode, and a first drain electrode, a second transistor including the second gate electrode, a second source electrode, and a second drain electrode, and a third transistor including the third gate electrode, a third source electrode, and a third drain electrode, wherein the insulation layer may have a first contact hole disposed on the first drain electrode, a second contact hole disposed on the second drain electrode, and a third contact hole disposed on the third drain electrode, wherein the first sub-pixel electrode may be electrically connected with the first drain electrode through the first contact hole, wherein the second sub-pixel electrode may be electrically connected with the second drain electrode through the second contact hole, and wherein the first contact hole, the second contact hole, and the third contact hole may be disposed at a same side with reference to the gate line.

The display device may further include a first data line and a second data line neighboring each other while crossing the gate line and the reference voltage line, the first data line and the second data line being configured to transmit a data signal, wherein the first data line may include a first protrusion connected with the first source electrode, wherein the second data line may include a second protrusion protruding toward the first data line, and wherein the first sub-pixel electrode may include: a first extension crossing the first protrusion, and a second extension crossing the second protrusion.

The display device may further include a shield electrode overlapping the first data line and the second data line, wherein the conductive shield portion may be separated from the shield electrode.

The reference voltage line may include an extension overlapping the third contact hole, wherein the third contact hole may overlap a part of the third drain electrode and a part of the first extension, wherein the pixel electrode layer may further include a connection member electrically connecting the third drain electrode and the first extension through the third contact hole, and wherein the conductive shield portion may be disposed in a same layer as the connection member and connected to the connection member.

The reference voltage line may include a first extension overlapping the third contact hole, wherein the third contact hole may overlap a part of the third drain electrode and a part of the first extension, wherein the pixel electrode layer may further include a connection member electrically connecting the third drain electrode and the first extension through the third contact hole, and wherein the conductive shield portion may be disposed in a same layer as the third drain electrode and connected to the third drain electrode.

The first edge may extend in a second direction, the second direction crossing a first direction in which the gate line extends, and wherein the conductive shield portion may include a portion that extends in the second direction.

The gate line may include a second extension that includes the first gate electrode, the second gate electrode, and the third gate electrode, and the first edge may be a part of an edge of the second extension.

According to one or more exemplary embodiments of the invention, a display device includes: a substrate; a gate line disposed on the substrate and configured to transmit a gate signal; a reference voltage line disposed apart from the gate line and configured to transmit a reference voltage; a first data line and a second data line configured to transmit a data signal and neighbor each other while crossing the gate line and the reference voltage line; a shield electrode that overlaps the first data line and the second data line; and a pixel electrode layer including: a first sub-pixel electrode disposed at a first side with reference to the gate line, and a second sub-pixel electrode disposed at a second side opposite to the first side with reference to the gate line, wherein the pixel electrode layer includes a shield portion overlapping an edge of the gate line, and the shield portion is separated from the shield electrode and electrically connected with the reference voltage line.

The shield portion may overlap a first edge, the first edge being a part of an edge of the gate line among two parallel edges of the gate line that is closer to the reference voltage line.

The gate line may include a first gate electrode, a second gate electrode, and a third gate electrode, and the display device may further include: a first transistor including the first gate electrode, a first source electrode, and a first drain electrode; a second transistor including the second gate electrode, a second source electrode, and a second drain electrode; a third transistor that includes the third gate electrode, a third source electrode, and a third drain electrode; and an insulation layer disposed on the first drain electrode, the second drain electrode, and the third drain electrode, wherein the insulation layer may have a first contact hole disposed on the first drain electrode, a second contact hole disposed on the second drain electrode, and a third contact hole disposed on the third drain electrode, wherein the first sub-pixel electrode may be electrically connected with the first drain electrode through the first contact hole, wherein the second sub-pixel electrode may be electrically connected with the second drain electrode through the second contact hole, and wherein the first contact hole, the second contact hole, and the third contact hole may be disposed at a same side with reference to the gate line.

The first data line may include a first protrusion connected with the first source electrode, wherein the second data line may include a second protrusion that protrudes toward the first data line, and wherein the first sub-pixel electrode may include a first extension crossing the first protrusion, and a second extension crossing the second protrusion.

The reference voltage line may include a first extension overlapping the third contact hole, wherein the third contact hole may overlap a part of the third drain electrode and a part of the first extension, wherein the pixel electrode layer may further include a connection member electrically connecting the third drain electrode and the first extension through the third contact hole, and wherein the shield portion may be disposed in a same layer as the connection member and connected to the connection member.

The gate line may include a second extension including the first gate electrode, the second gate electrode, and the third gate electrode, and wherein the first edge may be a part of an edge of the second extension.

The first edge may extend in a second direction, the second direction crossing a first direction in which the gate line extends, and wherein the shield portion may include a portion extending in the second direction.

According to one or more exemplary embodiments of the invention, a display device includes: a substrate; a gate line disposed on the substrate and configured to transmit a gate signal; a reference voltage line disposed apart from the gate line and configured to transmit a reference voltage; a first data line and a second data line neighboring each other while crossing the gate line and the reference voltage line, the first data line and the second data line being configured to transmit a data signal; a first transistor including a first gate electrode, a first source electrode, and a first drain electrode, the gate line comprising the first gate electrode; a second transistor including a second gate electrode, a second source electrode, and a second drain electrode, the gate line comprising the second gate electrode; and a third transistor including a third gate electrode, a third source electrode, and a third drain electrode, the gate line comprising the third gate electrode, wherein the third drain electrode may be electrically connected with the reference voltage line, wherein the display device may further include a shield member disposed in a same layer as the third drain electrode and connected to the third drain electrode, and wherein the shield member may overlap an edge of the gate line.

The display device may further include an insulation layer disposed on the first drain electrode, the second drain electrode, and the third drain electrode, wherein the insulation layer may have a first contact hole disposed on the first drain electrode, a second contact hole disposed on the second drain electrode, and a third contact hole disposed on the third drain electrode, and the display device may further include a first sub-pixel electrode electrically connected with the first drain electrode through the first contact hole, and a second sub-pixel electrode electrically connected with the second drain electrode through the second contact hole, and wherein the first contact hole, the second contact hole, and the third contact hole may be disposed at a same side with reference to the gate line.

The first sub-pixel electrode may be disposed at a first side with reference to the gate line, and the second sub-pixel electrode may be disposed at a second side, the second side being opposite to the first side, with reference to the gate line.

The shield member may be overlapped with a first edge, the first edge being a part of an edge closer to the reference voltage line among two parallel edges of the gate line, the first edge may extend in a second direction, the second direction crossing a first direction in which the gate line extends, and the shield member may include a portion that extends in the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 7 is a layout view of three pixels of a display device according to an exemplary embodiment.

DETAILED DESCRIPTION

Figure 1:
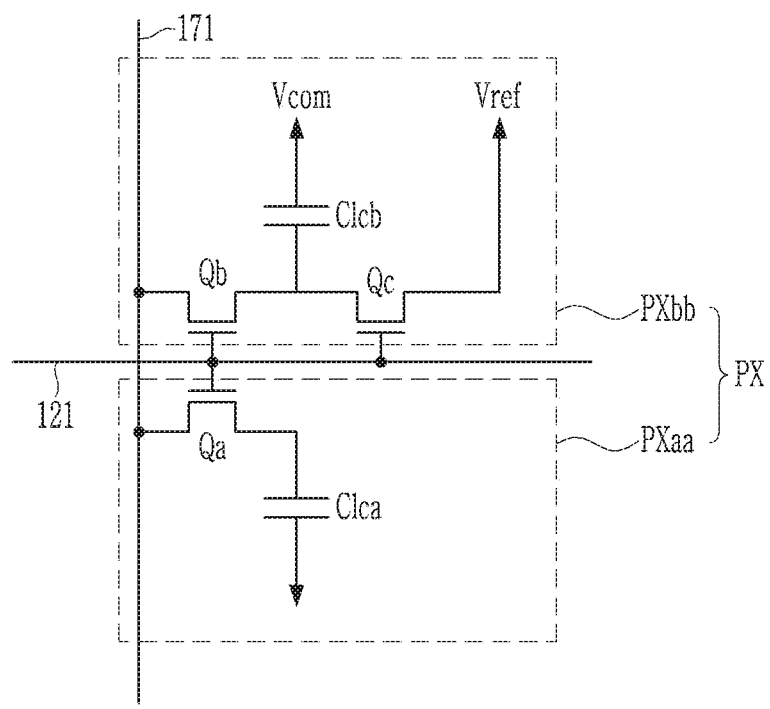
FIG. 1 is an equivalent circuit diagram of a pixel of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, a first direction DR1, a second direction DR2, and a third direction DR3 are not limited to three axes of a rectangular coordinate system, such as the x, y, and z-axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Throughout the specification, the term "in a plan view" implies a view (also expressed as on a plane) that observes a plane that is parallel with two directions that cross each other (e.g., the first direction DR1 and the second direction DR2), and the term, "in a cross-sectional view" implies a view that observes a plane cut in a direction (e.g., the third direction DR3) that is perpendicular to the plane that is parallel with the first direction DR1 and the second direction DR2. In addition, when two constituent elements overlaps, the two constituent elements overlap in the third direction DR3 (e.g., a direction that is perpendicular to a top surface of a substrate) unless otherwise mentioned.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Referring to FIG. 1, a display device according to an exemplary embodiment will now be described.

FIG. 1 is an equivalent circuit diagram of a pixel of the display device according to the exemplary embodiment.

The display device according to the exemplary embodiment includes a plurality of pixels PX, which are units for displaying an image. Referring to FIG. 1, one pixel PX may include a first sub-pixel PXaa and a second sub-pixel PXbb. The first sub-pixel PXaa may include a data line 171, a first transistor Qa that is connected to a gate line 121, and a first liquid crystal capacitor Clca that is connected with the first transistor Qa. The second sub-pixel PXbb may include the data line 171, a second transistor Qb that is connected to the gate line 121, a third transistor Qc, and a second liquid crystal capacitor Clcb that is connected with the second transistor Qb and the third transistor Qc.

The first transistor Qa includes a gate electrode connected to the gate line 121, a source electrode connected to the data line 171, and a drain electrode connected to the first liquid crystal capacitor Clca. The first transistor Qa is controlled by a gate signal transmitted by the gate line 121, and thus may transmit a data voltage transmitted by the data line 171 to the first liquid crystal capacitor Clca.

The second transistor Qb includes a gate electrode connected to the same gate line to which the first transistor Qa is connected, a source electrode connected to the data line 171, and a drain electrode connected to the second liquid crystal capacitor Clcb and a source electrode of the third transistor Qc. The second transistor Qb is controlled by a gate signal transmitted by the gate line 121, and thus may transmit a data voltage transmitted by the data line 171 to the second liquid crystal capacitor Clcb.

The third transistor Qc includes a gate electrode connected to the same gate line 121 to which the first transistor Qa is connected, the source electrode connected to the drain electrode of the second transistor Qb, and a drain electrode connected to a reference voltage Vref. The third transistor Qc is controlled by a gate signal transmitted by the gate line 121, and when the third transistor Qc and the second transistor Qb are turned on, the data voltage transmitted by the data line 171 is divided by the second transistor Qb and the third transistor Qc and thus may be transmitted to the second liquid crystal capacitor Clcb. The reference voltage Vref may be a predetermined constant voltage.

The first sub-pixel PXaa and the second sub-pixel PXbb may display an image according to different gamma curves, or an image according to the same gamma curve with respect to one input image signal. Here, the gamma curve implies a curve that shows a change of luminance or transmittance with respect to grayscales of an input image signal.

A gamma curve to which the second sub-pixel PXbb conforms may be controlled by controlling resistance ratios of the third transistor Qc and the second transistor Qb, the reference voltage Vref, and the like. A charge voltage of the second liquid crystal capacitor Clcb is adjusted by controlling the third transistor Qc, the reference voltage Vref, and the like, luminances of the two sub-pixels PXaa and PXbb may be changed, and side visibility of the display device can be improved by properly adjusting a voltage charged to the first liquid crystal capacitor Clca and the second liquid crystal capacitor Clcb.

Figure 2:
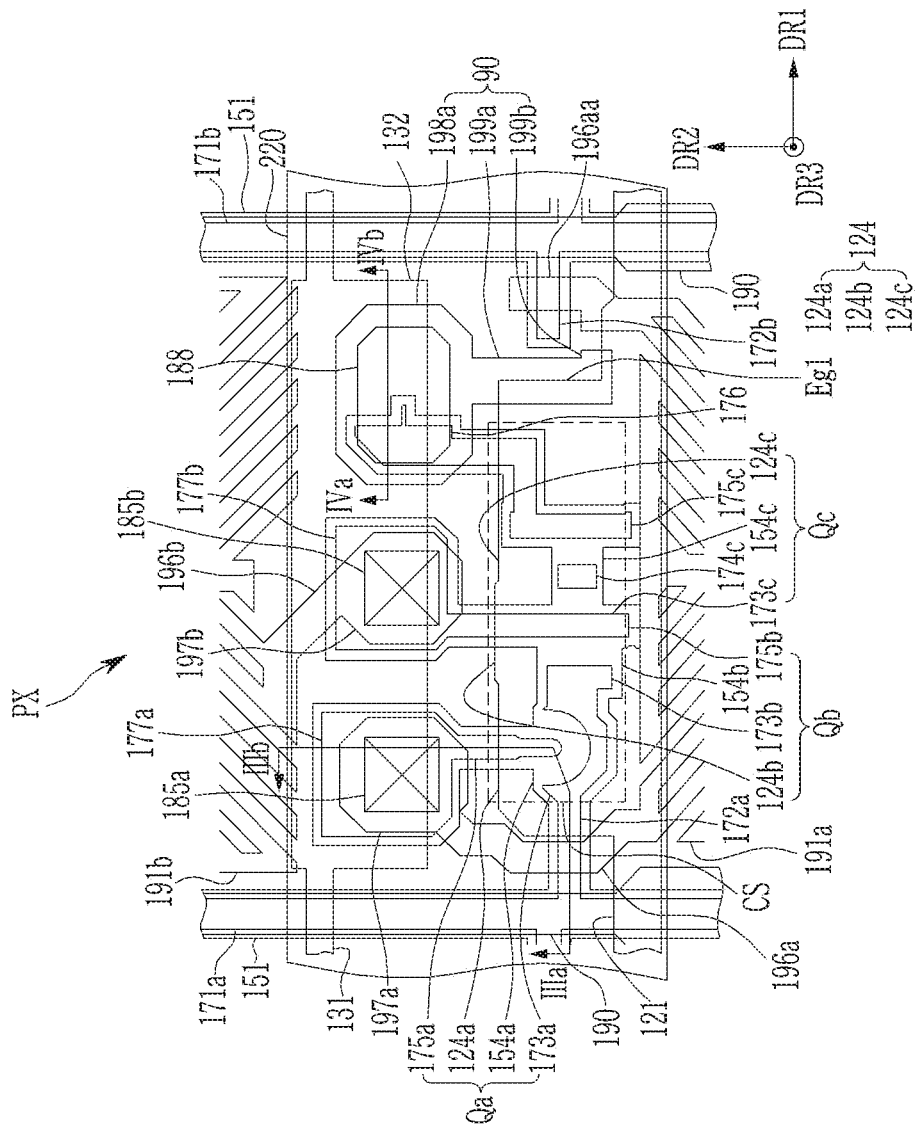
FIG. 2 is a layout view of a part of the pixel of the display device according to the exemplary embodiment.
Figure 3:
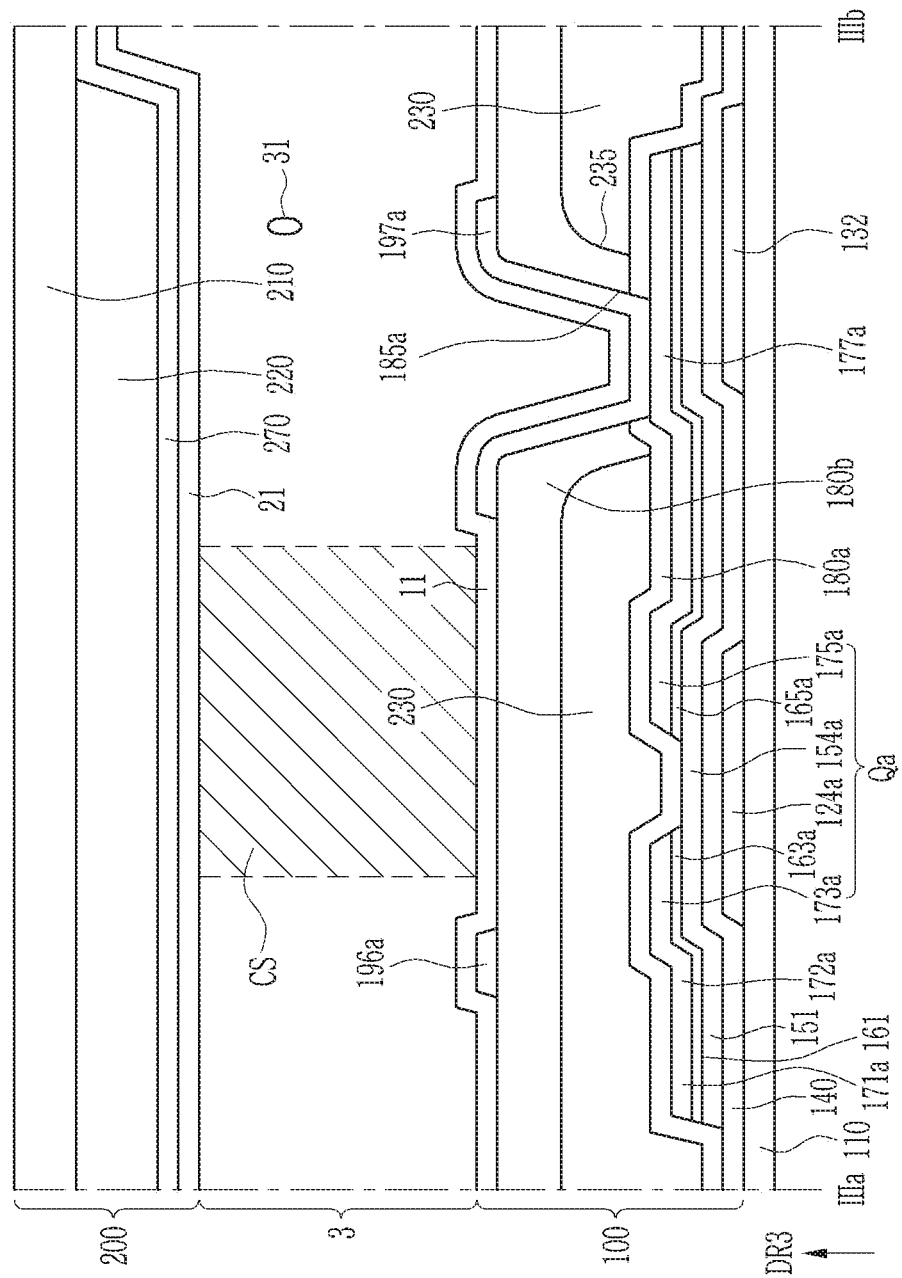
FIG. 3 is a cross-sectional view of the display device of FIG. 2. taken along a sectional line IIIa-IIIb.
Figure 4:
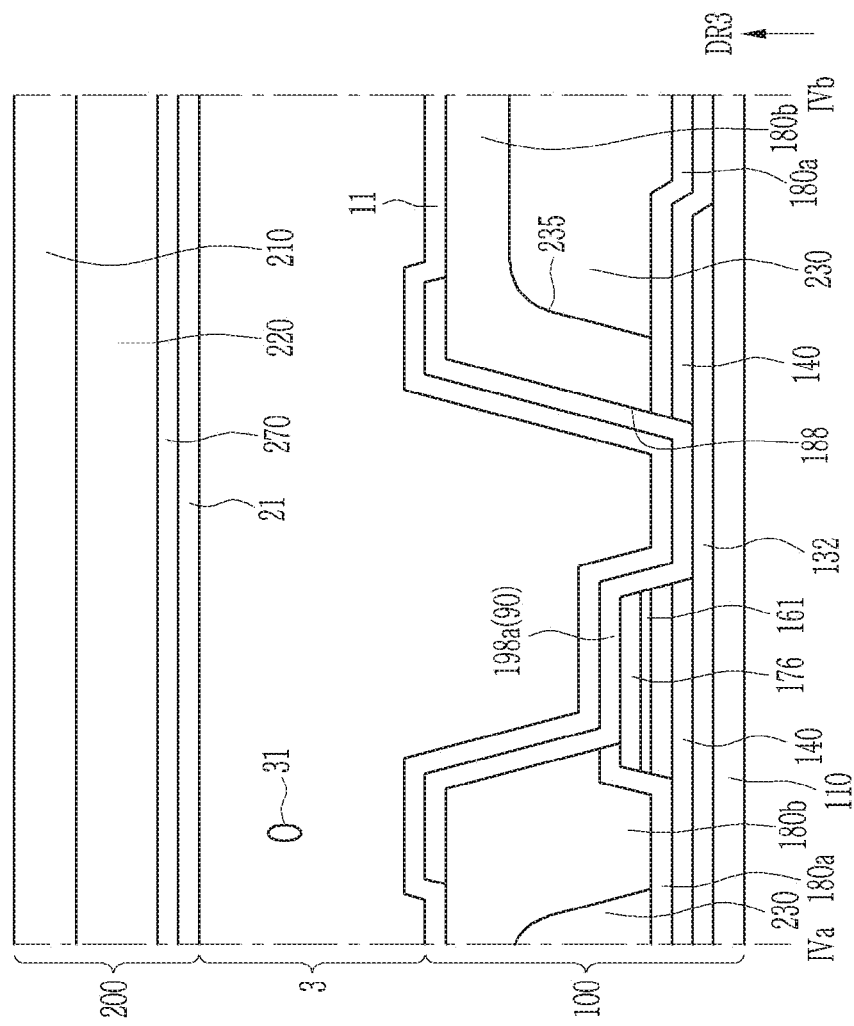
FIG. 4 is a cross-sectional view of the display device of FIG. 2. taken along a sectional line IVa-IVb.

Referring to FIGS. 2, 3, and 4, together with FIG. 1, a detailed structure of the display device according to the exemplary embodiment will be described.

FIG. 2 is a layout view of a part of a pixel of the display device according to the exemplary embodiment, FIG. 3 is a cross-sectional view of the display device of FIG. 2 taken along the sectional line IIIa-IIIb, and FIG. 4 is a cross-sectional view of the display device of FIG. 2 taken along the sectional line IVa-IVb.

The display device according to the exemplary embodiment is a liquid crystal display, and may include a first display panel 100, a second display panel 200, and a liquid crystal layer 3 that is disposed between the first and second display panels 100 and 200.

Regarding the first display panel 100, a gate conductive layer that includes a plurality of gate lines 121 and a reference voltage line 131 is disposed on an insulative substrate 110.

The gate lines 121 transmit a gate signal and may substantially extend in the first direction DR1. The gate lines 121 may include a first gate electrode 124a, a second gate electrode 124b, and a third gate electrode 124c. The first gate electrode 124a, the second gate electrode 124b, and the third gate electrode 124c may be connected with each other, and may be included together in one extension 124 of the gate line 121.

The extension 124 may have an edge Eg1 that extends above the gate line 121, while having a shape that protrudes or expands in the first direction DR1 from a portion of the gate line, extending in parallel with the first direction DR1. The edge Eg1 may substantially extend in the second direction DR2.

The second gate electrode 124b may be disposed between the first gate electrode 124a and the third gate electrode 124c.

The reference voltage line 131 transmits a reference voltage Vref, and may extend substantially in parallel with the gate line 121 at a distance from the gate line 121. The reference voltage line 131 may include an extension 132. The extension 132 may have a shape that protrudes or expands in a direction that is opposite to the first direction DR1 from a portion of the reference voltage line 131, extended in parallel with the first direction DR1. That is, a direction in which the extension 124 protrudes from the gate line 121 and a direction in which the extension 132 protrudes from the reference voltage line 131 may be opposite to each other. That is, the extension 124 of the gate line 121 and the extension 132 of the reference voltage line 131 are disposed between a portion of the gate line 121 extended in the first direction DR1 and a portion of the reference voltage line 131 extended in the first direction DR1, and the extension 124 and the extension 132 may face each other.

A gate insulation layer 140 may be disposed on the gate conductive layer. The gate insulation layer 140 may include an insulation material such as a silicon nitride (SiNx), a silicon oxide (SiOx), a silicon oxynitride, and the like.

A semiconductor layer 151 that includes a first semiconductor 154a, a second semiconductor 154b, and a third semiconductor 154c is disposed on the gate insulation layer 140. The first semiconductor 154a is disposed on the first gate electrode 124a and thus overlaps the first gate electrode 124a, the second semiconductor 154b is disposed on the second gate electrode 124b and thus overlaps the second gate electrode 124b, and the third semiconductor 154c is disposed on the third gate electrode 124c and thus overlaps the third gate electrode 124c. The first semiconductor 154a, the second semiconductor 154b, and the third semiconductor 154c may be connected with each other, and the second semiconductor 154b may be disposed between the first semiconductor 154a and the third semiconductor 154c.

The semiconductor layer 151 may include amorphous silicon, polycrystalline silicon, or a metal oxide.

An ohmic contact layer 161 that includes a plurality of ohmic contacts 163a and 165a may be disposed on the semiconductor layer 151.

A data conductive layer that includes a plurality of data lines 171a and 171b, a first source electrode 173a, a second source electrode 173b, a third source electrode 173c, a first drain electrode 175a, a second drain electrode 175b, and a third drain electrode 175c is disposed on the ohmic contact layer 161.

The first source electrode 173a and the second source electrode 173b are connected with each other, and the first source electrode 173a is connected with the data line 171a. The first drain electrode 175a may include one end portion that is surrounded by the first source electrode 173a while facing the first source electrode 173a, and an extension 177a that is disposed at the other end of the first drain electrode 175a. The second drain electrode 175b may include one end portion that extends in parallel with the second source electrode 173b while facing the second source electrode 173b, and an extension 177b that is disposed at the other end of the second drain electrode 175b. At least a part of the second drain electrode 175b may be the third source electrode 173c. The third drain electrode 175c may include one end portion that faces the third source electrode 173c and another end portion 176. The third drain electrode 175c is bent while extending in the second direction DR2 from the one end portion that faces the third source electrode 173c, extends in the first direction, and then is bent in the second direction DR2 and extends in the second direction DR2, such that the other end portion 176 is formed.

The data conductive layer may further include an auxiliary electrode 174c that is disposed between the third source electrode 173c and the third drain electrode 175c. The auxiliary electrode 174c with an island shape overlaps the third semiconductor 154c and the third gate electrode 124c.

The extension 177a of the first drain electrode 175a, the extension 177b of the second drain electrode 175b, and the end portion 176 of the third drain electrode 175c are disposed at one side with reference to the gate line 121, and may be substantially arranged in the first direction DR1. For example, as shown in FIG. 2, the extension 177a of the first drain electrode 175a, the extension 177b of the second drain electrode 175b, and the end portion 176 of the third drain electrode 175c may be disposed at an upper side with reference to the gate line 121, and may be arranged in the first direction DR1 from the left in the order or the extension 177a, the extension 177b, and the end portion 176 of the third drain electrode 175c.

At least a part of each of the extension 177a, the extension 177b, and the third drain electrode 175c may overlap the extension 132 of the reference voltage line 131.

The data lines 171a and 171b substantially extend in the second direction DR2, and may respectively transmit a data signal. Each of the data lines 171a and 171b may include a first protrusion 172a that protrudes in the first direction DR1 and a second protrusion 172b that protrudes opposite to the first direction DR1. That is, each of the data lines 171a and 171b may include the first protrusion 172a and the second protrusion 172b that protrude in opposite directions from each other. With reference to one pixel PX, the data line 171a disposed on the left side includes the first protrusion 172a that protrudes toward the data line 171b that is disposed on the right side, and the data line 171b may include the second protrusion 172b that protrudes toward the data line 171a that neighbors on the left side.

As shown in FIG. 2, the first protrusion 172a and the second protrusion 172b may be slightly misaligned rather than being aligned in the first direction DR1, or may be aligned in the first direction DR1.

The first source electrode 173a may be connected to the data line 171a through the first protrusion 172a.

The gate conductive layer and the data conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), or alloys thereof.

The data conductive layer and the ohmic contact layer 161 may substantially have the same planar shape. The planar shape of the data conductor and the planar shape of the semiconductor layer 151 may be substantially the same, excluding a portion between the first source electrode 173a and the first drain electrode 175a, a portion between the second source electrode 173b and the second drain electrode 175b, a portion between the third source electrode 173c and the auxiliary electrode 174c, and a portion between the auxiliary electrode 174c and the third drain electrode 175c. As shown in FIG. 2, a planar area of the semiconductor layer 151 may be slightly larger than that of the data conductive layer.

The first gate electrode 124a, the first source electrode 173a, and the first drain electrode 175a form a first transistor Qg together with the first semiconductor 154a, the second gate electrode 124b, the second source electrode 173b, and the second drain electrode 175b form a second transistor Qb together with the second semiconductor 154b, and the third gate electrode 124c, the third source electrode 173c, the auxiliary electrode 174c, and the third drain electrode 175c form a third transistor Qc together with the third semiconductor 154c.

Channels of the first transistor Qa, the second transistor Qb, and the third transistor Qc may be respectively formed in the first, second, and third semiconductors 154a, 154b, and 154c between the first, second, and third source electrode 173a, 173b, and 173c and the first, second, and third drain electrodes 175a, 175b, and 175c, respectively. The auxiliary electrode 174c is formed to extend a channel length of the third transistor Qc, but may be omitted as necessary.

The first transistor Qa, the second transistor Qb, and the third transistor Qc may be aligned in the first direction DR1, while overlapping the extension 124 of the gate line 121. For example, as shown in FIG. 2, the first transistor Qa, the second transistor Qb, and the third transistor Qc may be aligned in the first direction DR1 in such an order.

A first insulation layer 180a is disposed over the data conductive layer and exposed portions of the first, second, and third semiconductors 154a, 154b, and 154c. The first insulation layer 180a may include an organic insulation material or an inorganic insulation material.

A color filter layer that includes a plurality of color filters 230 may be disposed on the first insulation layer 180a. The color filters 230 may display one of three primary colors such as red, green, and blue. Each color filter 230 extends in the second direction DR2, and may correspond to a plurality of pixels PX arranged in one column. Color filters of a group, each displaying a different primary color, may be iteratively arranged in the first direction DR1.

Each color filter 230 may form an opening 235 by being removed on the extension 177a of the first drain electrode 175a, on the extension 177b of the second drain electrode 175b, on the end portion 176 of the third drain electrode 175c, and on part of the extension 132 of the reference voltage line 131 that is adjacent to the end portion 176.

A second insulation layer 180b may be disposed on the color filter 230. The second insulation layer 180b may include an inorganic insulation material or an organic insulation material, and particularly includes an organic insulation material and thus may substantially have a flat top surface. The second insulation layer 180b functions as an overcoat of the color filters 230 to prevent or limit the color filters 230 from being exposed, and also prevents or reduces permeation of an impurity such as a pigment into the liquid crystal layer 3.

The first insulation layer 180a and the second insulation layer 180b include a contact hole 185a that is formed on the extension 177a of the first drain electrode 175a, a contact hole 185b that is formed on the extension 177b of the second drain electrode 175b, and a contact hole 188 that is formed on the end portion 176 of the third drain electrode 175c and part of the extension 132 of the reference voltage line 131 that is adjacent to the end portion 176. In a plan view, the contact holes 185a, 185b, and 188 may respectively formed in the opening 235.

As shown in FIG. 2, the contact holes 185a, 185b, and 188 may be formed on the same side, for example, the top side, with reference to the gate line 121. The contact hole 185a, the contact hole 185b, and the contact hole 188 may be sequentially aligned in the first direction DR1 from the left side.

A pixel electrode that includes a pixel electrode including a plurality of first sub-pixel electrodes 191a and a plurality of second sub-pixel electrodes 191b, a shield electrode 190, and a connection member 90 may be disposed on the second insulation layer 180b.

With respect to each pixel PX, the first sub-pixel electrodes 191a may be disposed at one side and the second sub-pixel electrodes 191b may be disposed at the opposite side with reference to an area where the gate line 121, the reference voltage line 131, and the transistors Qa, Qb, and Qc are disposed. In the exemplary embodiment of FIG. 2, the first sub-pixel electrodes 191a may be disposed in the lower side with reference to the gate line 121, and the second sub-pixel electrodes 191b may be disposed in the upper side with reference to the gate line 121. A detailed shape of each of the first and second sub-pixel electrodes 191a and 191b will be described later.

Each of the first sub-pixel electrodes 191a may include an extension 196a protruding toward the extension 177a of the first drain electrode 175a and a contact portion 197a that is connected to an end of the extension 196a, and each of the second sub-pixel electrodes 191b may include an extension 196b protruding toward the extension 177a of the second drain electrode 175b and a contact portion 197b connected to an end of the extension 196b. The contact portion 197a is electrically connected with the extension 177a of the first drain electrode 175a through the contact hole 185a, and the contact portion 197b is electrically connected with the extension 177b of the second drain electrode 175b through the contact hole 185b.

The extension 196a may protrude upward at a top left edge portion of the first sub-pixel electrode 191a, and may extend upward while crossing the first protrusion 172a of the data line 171a. The extension 196a may extend between a portion of the data line 171a, extended in the second direction DR2 and the first transistor Qa. The extension 196a may be overlapped with an edge of the extension 124 of the gate line 121, or as shown in FIG. 2, may not overlap the edge of the extension 124 of the gate line 121.

The extension 196b may be protruded substantially at a center portion in a lower portion of the second sub-pixel electrode 191b.

The first sub-pixel electrode 191a may further include an extension 196aa that is located at the opposite side to the extension 196a. That is, the extension 196aa may protrude upward at a top right edge portion of the first sub-pixel electrode 191a. The extension 196aa may extend upward while crossing the second protrusion 172b that protrudes to the left of the data line 171b that is adjacent to the data line 171a. An area where the extension 196a and the first protrusion 172a overlap each other while crossing each other and an area where the extension 196a and the second protrusion 172b that overlap each other while crossing each other may be the same as or similar to each other.

The connection member 90 may include a contact portion 198a and protrusions 199a and 199b. The contact portion 198a is expanded compared to the protrusions 199a and 199b, and is electrically connected with the end portion 176 of the third drain electrode 175c and a part of the extension 132 of the reference voltage line 131 that is adjacent to the end portion 175 through the contact hole 188. Accordingly, the end portion 176 of the third drain electrode 175c is electrically connected with the extension 132 of the reference voltage line 131 through the conductive connection member 90 and thus may receive a reference voltage Vref. Thus, the third drain electrode 175c of the third transistor Qc may be connected to the reference voltage Vref.

The edge Eg1 of the extension 124 of the gate line 121 may overlap a conductive layer that is different from the gate conductive layer, and particularly, may overlap a conductive shielding portion that is disposed higher than the gate line 121. The edge Eg1 may be included in an upper edge of the gate line 121 that includes the extension 124, facing the reference voltage line 131, among the upper edge and a lower edge of the gate line 121. For example, the protrusion 199a shown in FIG. 2 protrudes downward from the contact portion 198a as an example of the shielding portion, and may extend substantially in parallel with the second direction DR2. The protrusion 199a overlaps the edge Eg1 of the extension 124 of the gate line 121, and may extend in parallel with the edge Eg1.

An end portion of the protrusion 199a is bent and thus forms a protrusion 199b that extends in the first direction DR1, and the protrusion 199b may be extended in parallel with an upper edge (i.e., a portion extended in the first direction DR1) of the gate line 121 connected to the edge Eg1 while overlapping the upper edge.

The protrusions 199a and 199b are disposed apart from the extension 196aa of the first sub-pixel electrode 191a.

The shield electrode 190 extends substantially in the second direction DR2, and may be disposed between two adjacent pixels PX. The shield electrode 190 shields an electric field from the data lines 171a and 171b by being overlapped with the data lines 171a and 171b, such that capacitive coupling between the data lines 171a and 171b and the first and second sub-pixel electrodes 191a and 191b and light leakage caused by the capacitive coupling can be prevented or reduced.

The pixel electrode layer may include a transparent conductive material such as an indium-tin oxide (ITO), an indium-zinc oxide (IZO), and a metal thin film.

An alignment layer 11 may be disposed on the pixel electrode layer and the second insulation layer 180b. The alignment layer 11 may be a vertical alignment layer. The alignment layer 11 may be rubbed in at least one direction, and may be an optical alignment layer that includes a photo-reactive material.

Regarding the second display panel 200, a light blocking member 220 may be disposed on a substrate 210 (in FIG. 3 and FIG. 4, below the substrate 210). As shown in FIG. 2, the light blocking member 220 includes a portion that extends in the first direction DR1 in a plan view, and the portion may overlap the extension 124 of the gate line 121, the extension 132 of the reference voltage line 131, the transistors Qa, Qb, and Qc, the extension 177a of the first drain electrode 175a, the extension 177b of the second drain electrode 175b, and the end portion 176 of the third drain electrode 175c. That is, the light blocking member 220 may extend across the first sub-pixel electrode 191a and the second sub-pixel electrode 191b, and may extend while overlapping the gate line 121 and the reference voltage line 131.

According to another exemplary embodiment, the light blocking member 220 may be disposed in the first display panel 100 rather than being disposed in the second display panel 200.

A common electrode 270 may be disposed on the light blocking member 220 (in FIG. 3 and FIG. 4, below the light blocking member 220). The common electrode 270 may be formed as a plate on the entire surface of the substrate 210. That is, a removed portion such as a slit may not exist in the common electrode 270. The common electrode 270 may transmit a constant common voltage Vcom. The reference voltage Vref transmitted by the reference voltage line 131 may be the same as or different from the common voltage Vcom. If the two voltages are different from each other, the reference voltage Vref may have a potential of about −2 V or +2 V.

The common electrode 270 may include a transparent conductive material such as ITO, IZO, a metal thin film, and the like.

An alignment layer 21 may be disposed on the common electrode 270 (in FIG. 3 and FIG. 4, below the common electrode 270). The alignment layer 21 may be a vertical alignment layer. The alignment layer 21 may be rubbed in at least one direction, and may be provided as an optical alignment layer that includes a photo-reactive material.

The liquid crystal layer 3 includes a plurality of liquid crystal molecules 31. The liquid crystal molecules 31 may have negative dielectric anisotropy, and may be aligned in a direction that is substantially perpendicular to the substrates 110 and 210 while no electric field is generated in the liquid crystal layer 3. The liquid crystal molecule 31 may be pre-tilted in a constant direction when an electric field is not generated in the liquid crystal layer 3.

The first sub-pixel electrode 191a may form a first liquid crystal capacitor Clca together with the common electrode 270 and the liquid crystal layer 3 disposed therebetween, and the second sub-pixel electrode 191b may form a second liquid crystal capacitor Clcb together with the common electrode 270 and the liquid crystal layer 3 disposed therebetween.

A plurality of spacers CS may be disposed between the first display panel 100 and the second display panel 200. In a plan view, the spacers CS may be disposed to be overlapped with the transistors Qa, Qb, and Qc. When the pixel electrode layer overlaps the spacers CS, a crack may occur in the pixel electrode layer, and thus the pixel electrode layer may not overlap the spacers CS. Thus, the extension 196a and the extension 196aa of the first sub-pixel electrode 191a may be protruded at the left and right edges of the first sub-pixel electrode 191a, while being adjacent to the data lines 171a 171b so as not to be overlapped with the spacers CS.

According to an exemplary embodiment, the contact hole 185a, the contact hole 185b, and the contact hole 188 that are included in one pixel PX are disposed on the same side with reference to the gate line 121, and are arranged in parallel with the first direction DR1. Thus, compared to a case in which the contact holes 185a, 185b, and 188 are disposed at the upper side and the lower side with reference to the gate line 121, the contact holes 185a, 185b, and 185c occupy less space and thus a width of the light blocking member 220 in the second direction DR2 can be more reduced, thereby increasing an aperture ratio and transmittance of the pixel PX.

Since the contact holes 185a, 185b, and 188 are disposed on the same side with reference to the gate line 121 in one pixel PX, one of the extension 196a of the first sub-pixel electrode 191a and the extension 196b of the second sub-pixel electrode 191b must cross the first protrusion 172 of the data lines 171a and 171b. In the exemplary embodiment of FIG. 2, the contact holes 185a, 185b, and 188 are disposed at the upper side with reference to the gate line 121, and the extension 196a of the first sub-pixel electrode 191a that is disposed at the lower side crosses the first protrusion 172a of the data line 171a. In this case, vertical crosstalk may occur due to parasitic capacitance between the first sub-pixel electrode 191a and the data line 171a and thus stains may be viewed, but in the present exemplary embodiment, the extension 196aa that is disposed opposite to the extension 196a of the first sub-pixel electrode 191a crosses the data line 171b that is adjacent to the data line 171a such that additional parasitic capacitance is formed, and accordingly, the vertical crosstalk between the first sub-pixel electrode 191a and the data line 171a can be compensated.

The gate line 121 transmits a gate signal having a potential that varies between a gate-off voltage and a gate-on voltage, and thus the liquid crystal layer 3 may be affected unless an electric field from the gate line 121 is appropriately shielded. In particular, when a strong electric field between the edge Eg1 of the extension 124 of the gate line 121 and the common electrode 270 is appropriately shielded, the liquid crystal layer 3 may be affected. In addition, the light blocking member 220 is disposed in the second display panel 200 and thus significant misalignment or distortion may occur between the first display panel 100 and the second display panel 200. In this case, the light blocking member 220 may not be overlapped with the entire extension 124 of the gate line 121. In this case, the influence of the electric field due to the edge Eg1 of the extension 124 of the gate line 121 can be visually recognized as light leakage, which results in a display fault.

In the present exemplary embodiment, the edge Eg1 of the extension 124 of the gate line 121 overlaps a shield layer that is disposed on a conductive layer that is different from the gate conductive layer and thus the electric field of the gate line 121 can be shielded, thereby preventing or reducing occurrence of the light leakage. As a detailed example, as a shielding portion, the protrusions 199a and 199b included in the connection member 90 that is disposed on the pixel electrode layer overlap the edge Eg1 of the extension 124 of the gate line 121 to shield the electric field, thereby preventing occurrence of the light leakage. In particular, in the extension 124 of the gate line 121, the edge Eg1 that extends in the second direction DR2 while being disposed close to the lower edge of the light blocking member 220 very possibly causes a light leakage when the light blocking member 220 is misaligned, and according to the present exemplary embodiment, the edge Eg1 of the extension 124 is shielded by the shielding portion, that is, the protrusions 199a and 199b of the connection member 90, such that occurrence of the light leakage can be prevented, and an optical characteristic of the display device can be improved. In addition, since the light leakage due to the edge Eg1 of the extension 124 is fundamentally shielded, a margin of the misalignment at the lower end of the light blocking member 220 can be ensured for the upper side of the extension 124 of the gate line 121.

In addition, as described above, a vertical width of the light blocking member 220 is designed to be minimized to increase an aperture ratio and transmittance, and the extension 196aa of the first sub-pixel electrode 191a is formed to compensate the vertical crosstalk, and thus there is no space where two adjacent shield electrodes 190 that can shield the electric field from the data lines 171a and 171b are extended in the first direction DR1 and thus overlap the extension 124 of the gate line 121. In addition, when such a space is needed, an area for the light blocking member 220 needs to be expanded. However, since the edge Eg1 of the extension 124 of the gate line 121 is shielded by the protrusions 199a and 199b of the connection member 90 as an example of the shielding portion that transmits a constant voltage, such a spatial limit can be overcome and occurrence of the light leakage can be effectively blocked while improving an aperture ratio and transmittance.

Another protrusion extended from the first sub-pixel electrode 191a may overlap the edge Eg1 of the extension 124 of the gate line 121, but in this case, an overlapped area between the first sub-pixel electrode 191a and the gate line 121 is increased and thus a voltage of the first sub-pixel electrode 191a may be changed due to a kickback voltage according to a signal change of the gate line 121, thereby resulting in deterioration of display quality. In the present exemplary embodiment, the protrusions 199a and 199b of the connection member 90, overlapping the edge Eg1 of the extension 124 of the gate line 121, transmit a reference voltage Vref, which is a constant voltage, and accordingly the above-stated problems do not occur.

A bottom side of the extension 124 of the gate line 121 is adjacent to or overlapped with an upper portion of the first sub-pixel electrode 191a in an area between the first sub-pixel electrode 191a and the second sub-pixel electrode 191b on a plane, and thus light leakage may not occur.

Next, a display device according to an exemplary embodiment will be described with reference to FIG. 5, together with the above-described drawings.

Figure 5:
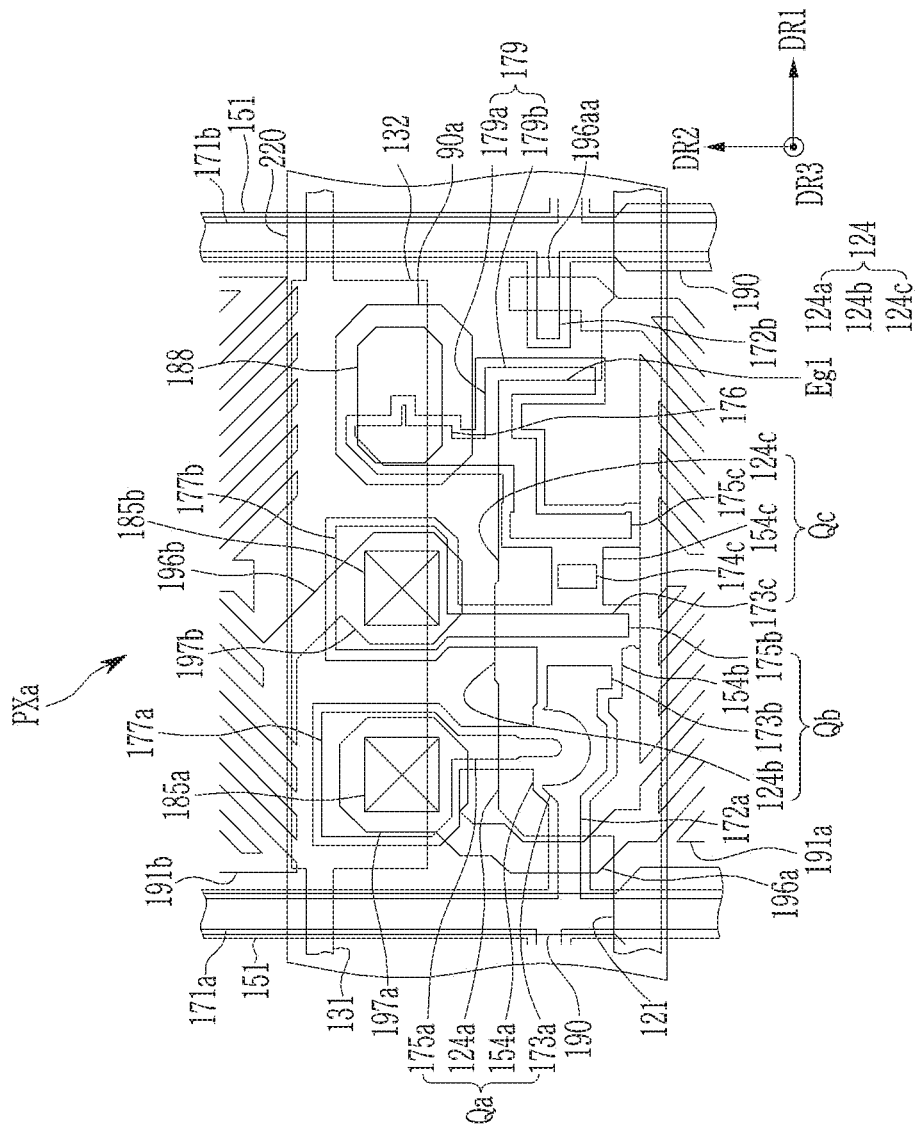
FIG. 5 and FIG. 6 are layout views of part of pixels of display devices according to exemplary embodiments.

FIG. 5 is a layout view of a part of a pixel PXa of a display device according to an exemplary embodiment.

Referring to FIG. 5, the pixel PXa of the display device according to the present exemplary embodiment is the same as the pixel of the display device of the above-described exemplary embodiment, except that a connection member 90a is included and a structure of part of a data conductive layer may be different.

The connection member 90a is almost the same as the connection member 90 of the above-described exemplary embodiment, but protrusions 199a and 199b may not be included. Instead, as an example of a shielding portion that can shield an electric field of an edge Eg1 of an extension 124 of a gate line 121, the data conductive layer may further include a shield member 179. The shield member 179 is disposed in the same layer as the third drain electrode 175c, and may be connected to the third drain electrode 175c. The shield member 179 may include a connection portion 179a that is directly connected with the third drain electrode 175c and an overlapping portion 179b that overlaps the edge Eg1 while being connected to the connection portion 179a. The connection portion 179a may extend in parallel with the first direction DR1 and the overlapping portion 179b may extend substantially in parallel with the second direction DR2, but the shape of the shield member 179 is not limited thereto.

According to the present exemplary embodiment, the overlapping portion 179b functions as the above-described protrusions 199a and 199b, and thus may prevent light leakage due to the edge Eg1 of the extension 124 of the gate line 121.

Since the overlapping portion 179b is disposed in the data conductive layer, it is not necessary to increase a margin of a distance with the first sub-pixel electrode 191a, and accordingly a spatial constraint can be reduced. In addition, in a cross-sectional view, since a distance between the overlapping portion 179b and the extension 124 of the gate line 121 is relatively close, an error in alignment between the overlapping portion 179b and the extension 124 of the gate line 121 is small and accordingly an overlay margin may be increased.

Next, a display device according to an exemplary embodiment will be described with reference to FIG. 6, together with the above-described drawings.

Figure 6:
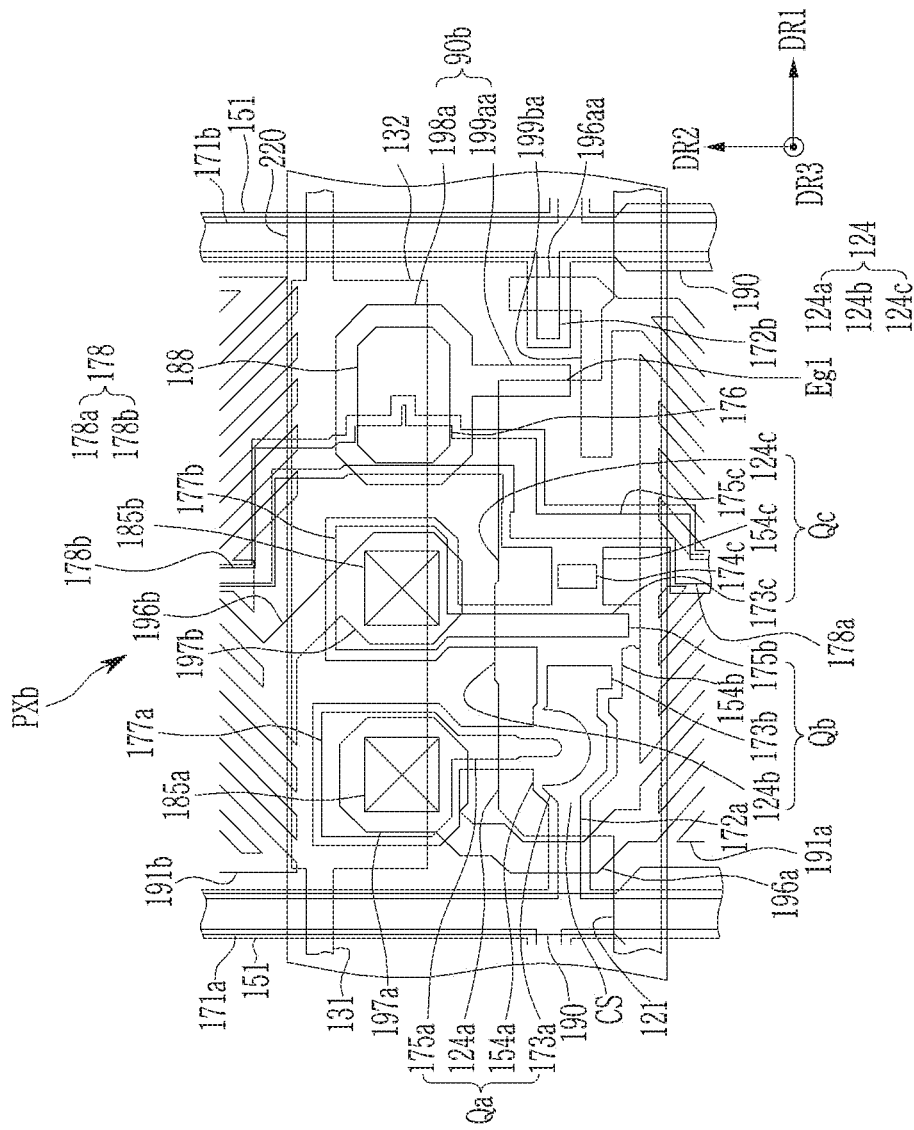

FIG. 6 is a layout view of a part of a pixel PXb of a display device according to an exemplary embodiment.

Referring to FIG. 6, a pixel PXb of a display device according to an exemplary embodiment is almost the same as the pixel of the display device according to the exemplary embodiment of FIGS. 1, 2, 3, and 4, but a data conductive layer may further include a vertical reference voltage line 178.

The vertical reference voltage line 178 may transmit a reference voltage Vref. The vertical reference voltage line 178 may include a vertical portion 178a that crosses a first sub-pixel electrode 191a while overlapping the same, and a vertical portion 178b that crosses a second sub-pixel electrode 191b while overlapping the same. The vertical reference voltage line 178 may extend substantially in the second direction DR2.

The end portion 176 of a third drain electrode 175c may further extend upward and thus may be connected with the vertical portion 178b of the vertical reference voltage line 178, and a lower end portion of the third drain electrode 175c may further extend downward and thus may be connected with the vertical portion 178a of the vertical reference voltage line 178.

A connection member 90b is almost the same as the connection member 90 of the above-described exemplary embodiment, and thus may include a contact portion 198a and a protrusion 199aa. The protrusion 199aa is almost the same the above-described protrusion 199a, but a length in the second direction DR2 may be shorter than that of the protrusion 199a and may cover only a part of an edge Eg1 of an extension 124 of a gate line 121. Instead, the first sub-pixel electrode 191a may further include a protrusion 199ba, which may overlap a lower portion of the edge Eg1 of the extension 124 of the gate line and an upper edge of the gate line, connected to the edge Eg1. The protrusion 199ba may be connected with an extension 196aa of the first sub-pixel electrode 191a, and may extend substantially in the first direction Dr1.

The protrusion 199aa and the protrusion 199ba function as the above-described protrusions 199a and 199b, and thus may prevent light leakage due to the edge Eg1 of the extension 124 of the gate line 121 and the upper edge of the gate line 121.

Next, a display device according to an exemplary embodiment will be described with reference to FIG. 7, together with the above-described drawings.

FIG. 7 is a layout view of three pixels PX1, PX2, and PX3 of a display device according to an exemplary embodiment.

Referring to FIG. 7, pixels PX1 and PX2 of a display device according to an exemplary embodiment may be the same as the pixels PX and PXa according to the above-described exemplary embodiment of FIGS. 1, 2, 3, and 4 or FIG. 5 in structure, and a structure of a pixel PX3 may be the same as the pixel PXb of the exemplary embodiment of FIG. 6 in structure.

Regarding shapes of first and second sub-electrodes 191a and 191b provided in each of the pixels PX1, PX2, and PX3, the first sub-pixel electrode 191a and the second sub-pixel electrode 191b may have a quadrangular shape.

The first sub-pixel electrode 191a may include a cross-shaped stem portion including a horizontal stem portion 192a and a vertical stem portion 193a, a plurality of branch portions 194a extending to the outside from the cross-shaped stem portion, an edge portion 195a that defines an outer edge side, and the above-described extension 196a and contact portion 197a. The second sub-pixel electrode 191b may include a cross-shaped stem portion that includes a horizontal stem portion 192b and a vertical stem portion 193b, a plurality of branch portions 194b that extend to the outside from the cross-shaped stem portion, and an edge portion 195b that defines an outer edge side, and the above-described extension 196b and the contact portion 197b.

A planar area of the first sub-pixel electrode 191a may be smaller than a planar area of the second sub-pixel electrode 191b.

A primary color of a color filter 230 that corresponds to a pixel array where the pixel PX1 is located, a primary color of a color filter 230 that corresponds to a pixel array where the pixel PX2 is located, and a primary color of a color filter 230 that corresponds to a pixel array where the pixel PX3 is located may be different from each other. For example, the pixel PX1 may correspond to a red color filter, the pixel PX2 may correspond to a green color filter, and the pixel PX3 may correspond to a blue color filter.

The reference voltage line 131 may include a vertical portion 133 that extends in the second direction DR2, except for a portion that extends in the first direction DR1 and where an extension 132 is disposed, a vertical portion 134 that is connected to the vertical portion 133, and vertical portions 135a and 135b that are connected to the vertical portion 134 and disposed at the left and right sides of the sub-pixel electrode 191a, while extending in the second direction DR2. The vertical portion 134 may be disposed corresponding to a boundary of two adjacent pixels in the second direction DR2.

The vertical portion 133 may be disposed in some (e.g., the pixel PX3) rather than in all the pixels PX1, PX2, and PX3. For example, the vertical portion 133 may extend while overlapping the vertical stem portion 193b of the second sub-pixel electrode 191b. The vertical portions 135a and 135b may be disposed in all three pixels PX1, PX2, and PX3.

The above-described vertical reference voltage line 178 may be disposed in some (e.g., the pixel PX3) rather than in all the pixels PX1, PX2, and PX3. For example, the vertical portion 178a of the vertical reference voltage line 178 may extend while overlapping a vertical stem portion 193a of a first sub-pixel electrode 191a of the pixel PX3, and the vertical portion 178b may extend, while overlapping a vertical stem portion 193b of a second sub-pixel electrode 191b of the pixel PX3. The vertical reference voltage line 178 may transmit a reference voltage Vref to the second direction DR2 in the display device.

A width of the pixel PX3, which may be a pixel that displays a blue color, in the first direction DR1 may be larger than a width of the two other pixels PX1 and PX2 in the first direction DR1. That is, a distance between two adjacent data lines 171 that are disposed at opposite sides of the pixel PX3 may be longer than a distance between two data lines 171 that are disposed at opposite sides of each of the two other pixels PX1 and PX2. Alternatively, a width of the first and second sub-pixel electrodes 191a and 191b included in the pixel PX3 in the first direction DR1 may be larger than a width of the first and second sub-pixel electrodes 191a and 191b included in each of the other two pixels PX2 and PX3 in the first direction DR1. Alternatively, an area of the first and second sub-pixel electrodes 191a and 191b included in the pixel PX3 may be larger than an area of the first and second sub-pixel electrodes 191a and 191b included in the two other pixels PX1 and PX2.

Accordingly, an aperture ratio of the pixel PX3 may be greater than that of the other two pixels PX1 and PX2, but as shown in FIG. 7, the aperture ratio of the pixel PX3 is reduced due to the vertical reference voltage line 178 that is disposed crossing the pixel PX3 such that the entire aperture ratio and transmittance of the pixel PX3 may be substantially the same as the entire aperture and transmittance of the other two pixels PX1 and PX2.

Since the area of the first and second sub-pixel electrodes 191a and 191b included in the pixel PX3 is relatively large, as described in the exemplary embodiment of FIG. 6, an effect of a kickback voltage generated from overlapping of the protrusion 199ba of the first sub-pixel electrode 191a and the edge Eg1 of the extension 124 of the gate line 121 may have reduced effect in the display quality.

According to exemplary embodiments of the present invention, the display device may have improved optical characteristics by preventing or reducing light leakage while increasing an aperture ratio and transmittance of the display device.

Although certain exemplary embodiments and implementations have been described herein, other embodiments and modifications will be apparent from this description.

Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a gate line disposed on the substrate and configured to transmit a gate signal, the gate line longitudinally extending along a first direction;
a reference voltage line disposed apart from the gate line and configured to transmit a reference voltage;
an insulation layer disposed on the gate line and the reference voltage line;
a pixel electrode layer comprising:
a first sub-pixel electrode disposed on the insulation layer and located at a first side with reference to the gate line; and
a second sub-pixel electrode disposed on the insulation layer and located at a second side opposite to the first side with reference to the gate line; and
a conductive shield portion disposed on the gate line,
wherein the gate line comprises two parallel edges, an edge closer to the reference voltage line among the two parallel edges comprising a first edge extending along a second direction crossing the first direction, and
wherein the conductive shield portion overlaps the first edge.

2. The display device of claim 1, wherein the conductive shield portion is configured to transmit a constant voltage.

3. The display device of claim 2, wherein the gate line comprises a first gate electrode, a second gate electrode, and a third gate electrode, and
wherein the display device further comprises:
a first transistor comprising the first gate electrode, a first source electrode, and a first drain electrode;
a second transistor comprising the second gate electrode, a second source electrode, and a second drain electrode; and
a third transistor comprising the third gate electrode, a third source electrode, and a third drain electrode;
wherein the insulation layer has a first contact hole disposed on the first drain electrode, a second contact hole disposed on the second drain electrode, and a third contact hole disposed on the third drain electrode,
wherein the first sub-pixel electrode is electrically connected with the first drain electrode through the first contact hole,
wherein the second sub-pixel electrode is electrically connected with the second drain electrode through the second contact hole, and
wherein the first contact hole, the second contact hole, and the third contact hole are disposed at a same side with reference to the gate line.

4. The display device of claim 3, further comprising a first data line and a second data line neighboring each other while crossing the gate line and the reference voltage line, the first data line and the second data line being configured to transmit a data signal,
wherein the first data line comprises a first protrusion connected with the first source electrode,
wherein the second data line comprises a second protrusion protruding toward the first data line, and
wherein the first sub-pixel electrode comprises:
a first extension crossing the first protrusion; and
a second extension crossing the second protrusion.

5. The display device of claim 4, further comprising a shield electrode
overlapping the first data line and the second data line,
wherein the conductive shield portion is separated from the shield electrode.

6. The display device of claim 4, wherein the reference voltage line comprises an extension overlapping the third contact hole,
wherein the third contact hole overlaps a part of the third drain electrode and a part of the first extension,
wherein the pixel electrode layer further comprises a connection member electrically connecting the third drain electrode and the first extension through the third contact hole, and
wherein the conductive shield portion is disposed in a same layer as the connection member and connected to the connection member.

7. The display device of claim 3, wherein the reference voltage line comprises a first extension overlapping the third contact hole,
wherein the third contact hole overlaps a part of the third drain electrode and a part of the first extension,
wherein the pixel electrode layer further comprises a connection member electrically connecting the third drain electrode and the first extension through the third contact hole, and
wherein the conductive shield portion is disposed in a same layer as the third drain electrode and connected to the third drain electrode.

8. The display device of claim 3,
wherein the conductive shield portion comprises a portion that extends in the second direction.

9. The display device of claim 8, wherein the gate line comprises a second extension that includes the first gate electrode, the second gate electrode, and the third gate electrode, and the first edge is a part of an edge of the second extension.

10. A display device comprising:
a substrate;
a gate line disposed on the substrate and configured to transmit a gate signal, the gate line longitudinally extending along a first direction;
a reference voltage line disposed apart from the gate line and configured to transmit a reference voltage;
a first data line and a second data line configured to transmit a data signal and neighbor each other while crossing the gate line and the reference voltage line;
a shield electrode that overlaps the first data line and the second data line; and
a pixel electrode layer comprising:
a first sub-pixel electrode disposed at a first side with reference to the gate line; and
a second sub-pixel electrode disposed at a second side opposite to the first side with reference to the gate line,
wherein the pixel electrode layer comprises a shield portion overlapping an edge of the gate line, the edge extending along a second direction crossing the first direction, and
the shield portion is separated from the shield electrode and electrically connected with the reference voltage line.

11. The display device of claim 10, wherein the shield portion overlaps a first edge, the first edge being a part of an edge of the gate line among two parallel edges of the gate line that is closer to the reference voltage line.

12. The display device of claim 11, wherein the gate line comprises a first gate electrode, a second gate electrode, and a third gate electrode,
wherein the display device further comprises:
a first transistor comprising the first gate electrode, a first source electrode, and a first drain electrode;
a second transistor comprising the second gate electrode, a second source electrode, and a second drain electrode;
a third transistor comprising the third gate electrode, a third source electrode, and a third drain electrode; and
an insulation layer disposed on the first drain electrode, the second drain electrode, and the third drain electrode,
wherein the insulation layer has a first contact hole disposed on the first drain electrode, a second contact hole disposed on the second drain electrode, and a third contact hole disposed on the third drain electrode,
wherein the first sub-pixel electrode is electrically connected with the first drain electrode through the first contact hole,
wherein the second sub-pixel electrode is electrically connected with the second drain electrode through the second contact hole, and
wherein the first contact hole, the second contact hole, and the third contact hole are disposed at a same side with reference to the gate line.

13. The display device of claim 12, wherein the first data line comprises a first protrusion connected with the first source electrode,
wherein the second data line comprises a second protrusion that protrudes toward the first data line, and
wherein the first sub-pixel electrode comprises a first extension crossing the first protrusion, and a second extension crossing the second protrusion.

14. The display device of claim 12, wherein the reference voltage line comprises a first extension overlapping the third contact hole,
wherein the third contact hole overlaps a part of the third drain electrode and a part of the first extension,
wherein the pixel electrode layer further comprises a connection member electrically connecting the third drain electrode and the first extension through the third contact hole, and
wherein the shield portion is disposed in a same layer as the connection member and connected to the connection member.

15. The display device of claim 12, wherein the gate line comprises a second extension comprising the first gate electrode, the second gate electrode, and the third gate electrode, and
wherein the first edge is a part of an edge of the second extension.

16. The display device of claim 11,
wherein the shield portion comprises a portion extending in the second direction.

17. A display device comprising:
a substrate;
a gate line disposed on the substrate and configured to transmit a gate signal, the gate line longitudinally extending along a first direction;
a reference voltage line disposed apart from the gate line and configured to transmit a reference voltage;
a first data line and a second data line neighboring each other while crossing the gate line and the reference voltage line, the first data line and the second data line being configured to transmit a data signal;
a first transistor comprising a first gate electrode, a first source electrode, and a first drain electrode, the gate line comprising the first gate electrode;
a second transistor comprising a second gate electrode, a second source electrode, and a second drain electrode, the gate line comprising the second gate electrode; and
a third transistor comprising a third gate electrode, a third source electrode, and a third drain electrode, the gate line comprising the third gate electrode,
wherein the third drain electrode is electrically connected with the reference voltage line,
wherein the display device further comprises a shield member disposed in a same layer as the third drain electrode and connected to the third drain electrode, and
wherein the shield member overlaps an edge of the gate line, the edge extending along a second direction crossing the first direction.

18. The display device of claim 17, further comprising an insulation layer disposed on the first drain electrode, the second drain electrode, and the third drain electrode,
wherein the insulation layer has a first contact hole disposed on the first drain electrode, a second contact hole disposed on the second drain electrode, and a third contact hole disposed on the third drain electrode,
wherein the display device further comprises a first sub-pixel electrode electrically connected with the first drain electrode through the first contact hole, and a second sub-pixel electrode electrically connected with the second drain electrode through the second contact hole, and
wherein the first contact hole, the second contact hole, and the third contact hole are disposed at a same side with reference to the gate line.

19. The display device of claim 18, wherein the first sub-pixel electrode is disposed at a first side with reference to the gate line, and the second sub-pixel electrode is disposed at a second side, the second side being opposite to the first side with reference to the gate line.

20. The display device of claim 17, wherein the shield member is overlapped with a first edge, the first edge being a part of an edge closer to the reference voltage line among two parallel edges of the gate line,
the first edge extends in the second direction, and
the shield member comprises a portion that extends in the second direction.

\* \* \* \* \*